(12) United States Patent
Fowler et al.

(10) Patent No.: US 12,272,633 B2
(45) Date of Patent: Apr. 8, 2025

(54) TOP HAT STRUCTURE FOR ISOLATION CAPACITORS

(71) Applicant: Skyworks Solutions, Inc., Irvine, CA (US)

(72) Inventors: Thomas C. Fowler, Georgetown, TX (US); Jerome T. Wenske, Cedar Creek, TX (US); Ahsanul Islam, Pflugerville, TX (US); Dan B. Kasha, Seattle, WA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 16/728,224

(22) Filed: Dec. 27, 2019

(65) Prior Publication Data

US 2021/0202375 A1 Jul. 1, 2021

(51) Int. Cl.
| | |
|---|---|
| *H01L 21/60* | (2006.01) |
| *H01L 23/00* | (2006.01) |
| *H01L 23/522* | (2006.01) |
| *H01L 23/528* | (2006.01) |
| *H01L 23/532* | (2006.01) |
| *H01L 29/06* | (2006.01) |
| *H01L 49/02* | (2006.01) |

(52) U.S. Cl.
CPC ...... *H01L 23/5223* (2013.01); *H01L 23/5226* (2013.01); *H01L 23/528* (2013.01); *H01L 23/53295* (2013.01); *H01L 24/03* (2013.01); *H01L 24/05* (2013.01); *H01L 24/48* (2013.01); *H01L 24/85* (2013.01); *H01L 28/60* (2013.01); *H01L 2224/04042* (2013.01); *H01L 2224/0557* (2013.01); *H01L 2924/19041* (2013.01)

(58) Field of Classification Search
CPC . H01L 2224/48463; H01L 2224/05093; H01L 23/5223
See application file for complete search history.

(56) References Cited

U.S. PATENT DOCUMENTS

| | | | |
|---|---|---|---|
| 7,732,301 B1 * | 6/2010 | Pinnington | H01L 21/2654 438/455 |
| 8,802,504 B1 * | 8/2014 | Hou | H01L 23/5226 438/125 |
| 8,890,223 B1 * | 11/2014 | Bonifield | H01L 23/5222 257/296 |
| 9,299,697 B2 | 3/2016 | West et al. | |
| 9,520,354 B1 * | 12/2016 | Chow | H01L 28/40 |

(Continued)

*Primary Examiner* — Kyoung Lee
*Assistant Examiner* — David J Goodwin
(74) *Attorney, Agent, or Firm* — Knobbe, Martens, Olson & Bear, LLP

(57) ABSTRACT

An isolation capacitor structure reduces the likelihood of breakdown in the passivation layers by physically re-shaping or dividing the top plate of the isolation capacitor into two segments. In that way, the electric field is driven down and away from the passivation surfaces. One embodiment utilizes a series capacitor formed by the top metal plate of the capacitor and an additional "top hat" plate above the top metal plate that redirects the fields into the main isolation capacitor. Vias may be included between the top hat plate and the top metal plate. Another approach reshapes the top plate to have an integrated top hat structure and achieves similar results of directing charge down and away from the passivation layer surface breakdown paths.

16 Claims, 8 Drawing Sheets

(56) References Cited

U.S. PATENT DOCUMENTS

| | | |
|---|---|---|
| 9,583,558 B2 | 2/2017 | West et al. |
| 9,768,245 B2 | 9/2017 | West et al. |
| 10,074,713 B1 | 9/2018 | Briano |
| 10,147,784 B2 | 12/2018 | West et al. |
| 2007/0296085 A1* | 12/2007 | Coolbaugh ............. H01L 28/60 257/E21.011 |
| 2008/0277761 A1 | 11/2008 | Mahalingam et al. |
| 2009/0124073 A1* | 5/2009 | Liu ......................... H01L 24/05 438/612 |
| 2010/0167522 A1* | 7/2010 | Daubenspeck ......... H01L 24/03 257/E21.295 |
| 2011/0032660 A1* | 2/2011 | Dunn .................... H01G 4/1209 257/532 |
| 2011/0062549 A1* | 3/2011 | Lin ....................... H01L 23/642 257/532 |
| 2014/0045327 A1* | 2/2014 | Chen ....................... H01L 24/85 438/617 |
| 2016/0172434 A1 | 6/2016 | West et al. |
| 2016/0379960 A1* | 12/2016 | Huang .............. H01L 27/14636 257/432 |
| 2017/0263696 A1* | 9/2017 | West ....................... H01L 28/00 |
| 2018/0068946 A1 | 3/2018 | Ho et al. |
| 2018/0166375 A1 | 6/2018 | Stecher et al. |
| 2018/0332707 A1 | 11/2018 | Akahoshi et al. |
| 2019/0074350 A1 | 3/2019 | West et al. |
| 2019/0206981 A1* | 7/2019 | Bonifield ............. H01L 23/528 |
| 2020/0193791 A1 | 6/2020 | Gonzales |
| 2020/0235197 A1* | 7/2020 | Sizov ................. H01L 23/5223 |

* cited by examiner

TOP HAT STRUCTURE FOR ISOLATION CAPACITORS

BACKGROUND

Field of the Invention

This application relates to capacitors and more particularly to capacitors used in isolation applications.

Description of the Related Art

Isolation communication channels are utilized in various applications where necessary to prevent current flow between separate isolated electric circuits while still maintaining communication between the circuits. The isolation may be required for signal isolation, safety, or for other reasons. The isolation communication channels may be implemented using capacitive techniques.

Referring to FIG. 1 a typical isolation capacitor 100 includes a top metal plate 101, a bottom metal plate 103 above a silicon substrate 105, and a region of insulator material such as SiO2 (intermetal dielectric (IMD)) 106 between the bottom metal plate and the top metal plate. Passivation layers 107, which vary from fabrication facility to fabrication facility and process to process, and are typically comprised of multiple stacked materials such as SiO2 and SiN, serve as a protective barrier to protect the integrated circuit. The isolation capacitor 100 allows for low voltage signaling, e.g., of approximately 1-3 volts for transfer of information (e.g., based on pulse width of the signal or other information in the signal). The bond wire 109 used in the low voltage signaling can experience large non-signal voltages from hundreds to even thousands of volts relative to the integrated circuit in which the capacitor is disposed. Those high voltages are also applied to the top plate through the bond wire. The IMD layer 106 isolates the large non-signal voltages from other circuits in the integrated circuit.

A guard ring 110 is placed at a distance from the isolation capacitor to protect circuits outside of the guard ring. The guard ring is formed by metal in each metal layer coupled by vias to form a vertical guard ring coupled to ground so any charge received at the guard ring goes to ground. The guard ring is placed, e.g., at a distance 10 times the thickness of the intermetal dielectric layer (IMD), which is the distance between the top metal plate and the bottom metal plate. Note that a horizontal capacitor is formed between the top metal layer and the guard ring. Electric fields 121 under large voltages that can be experienced by the isolation capacitor extend into the passivation layers and can cause the passivation layers to break down, catastrophically damaging the integrated circuit. Accordingly, improved isolation techniques are desirable.

SUMMARY OF EMBODIMENTS OF THE INVENTION

In one embodiment an integrated circuit includes a first conductive plate above a substrate and a second conductive plate above the first conductive plate. A first dielectric layer is between the first conductive plate and the second conductive plate. A third conductive plate is above the second conductive plate and a second dielectric layer between the second conductive plate and the third conductive plate. The third conductive plate is smaller than the second conductive plate. In an embodiment, a plurality of vias are between the third conductive plate and the second conductive plate to electrically connect the third conductive plate and the second conductive plate.

In another embodiment an integrated circuit includes a first conductive plate above a substrate, a second conductive plate above the first conductive plate, and a first dielectric layer between the first conductive plate and the second conductive plate. The second conductive plate is formed with a center portion having a greater thickness than outer portions of the second conductive plate.

In another embodiment a method of making an isolation capacitor includes forming a first conductive plate above a substrate, forming a first dielectric layer above the first conductive plate, forming a second conductive plate above the first dielectric layer, forming a second dielectric layer above the second conductive plate, and forming a third conductive plate above the second dielectric layer and the third conductive plate is smaller than the second conductive plate. The method may further include forming a plurality of vias connecting the second conductive plate and the third conductive plate.

In another embodiment, a method of forming an integrated circuit includes, forming a first conductive plate above a substrate, forming a first dielectric layer above the first conductive plate, and forming a second conductive plate above the first dielectric layer with a center portion of the second conductive plate having a greater thickness than an outer portion of the second conductive plate.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
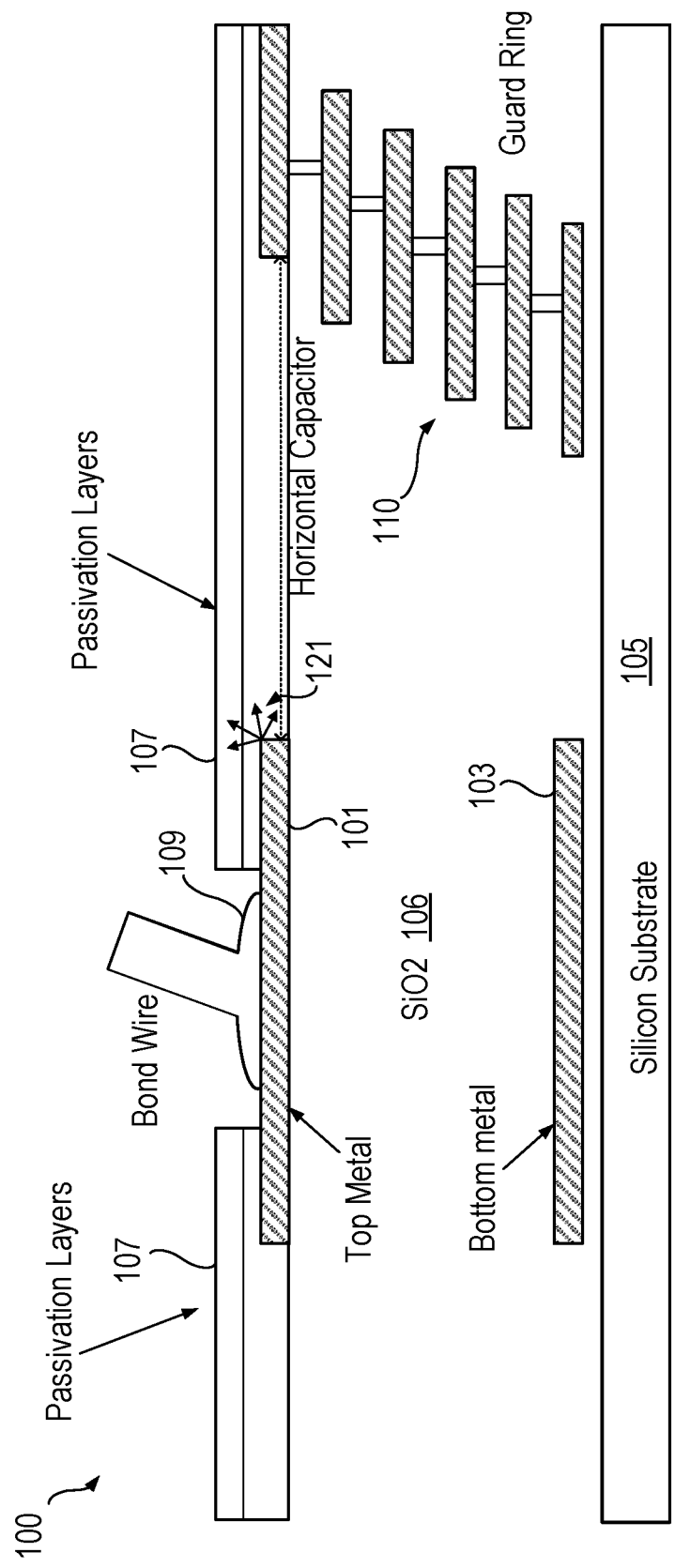
FIG. 1 illustrates a prior art isolation capacitor and guard ring.

Isolation capacitor structures such as shown in FIG. 1 have a tendency to break down at voltages much lower than theoretical for an oxide based capacitive structure. That unexpected breakdown can occur in the passivation layers. The breakdown is believed to be the result of failure along resistive paths at the surface (likely the result of charge traps created at interface layers during passivation material processing and between layers of passivation materials). Embodiments described herein reduce the likelihood of breakdown in the passivation layers either through physically re-shaping or dividing the top plate of the isolation capacitor into two segments. In that way, the electric field is driven down and away from the passivation surfaces. One embodiment utilizes a series capacitor formed by the top metal plate and an additional "top hat" plate above the top metal plate that actively redirects the fields into the main isolation capacitor while not appreciably reducing necessary dielectric thickness. A related, second approach uses vias between the top hat plate and the top metal plate. Another embodiment reshapes the top plate to have an integrated top hat and achieves similar results of directing charge down and away from the passivation layer surface breakdown paths.

Figure 2:
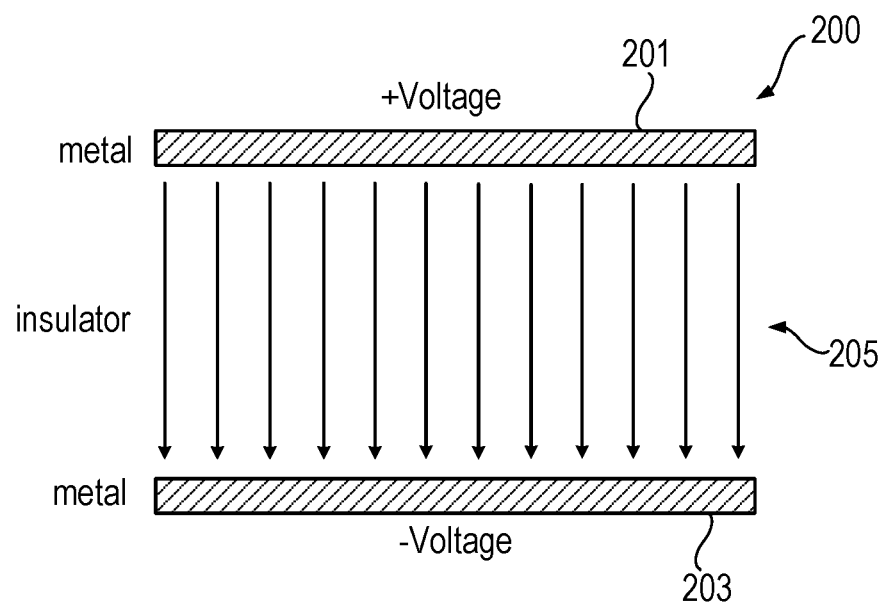
FIG. 2 illustrates a simplified model of electric fields in a cross section of a parallel plate capacitor.

Before proceeding with additional details of various embodiments, FIG. 2 illustrates simplified model of electric fields in a cross section of a parallel plate capacitor 200. The parallel plate capacitor includes a top metal plate 201 and a bottom metal plate 203. Field lines 205 extend through the insulating material from the top metal plate to the bottom metal plate. The conventional parallel plate capacitor equation is $C=\varepsilon_o \times k \times A/d$, where $\varepsilon_o$ is permittivity of free space, k is material relative permittivity (written sometimes as A is plate area, and d is the spacing between the top plate 201 and the bottom plate 203. The electric field $E=V/d$, where d is the spacing between plates and V is the applied voltage (or $E=k \times Q/r^2$, where k is the electric constant of $(\sim 9 \times 10^9$ $Nm^2/C^2)$, Q is source charge, and r is separation distance between charges in meters). The simple capacitor equation shows a uniform field between the plates as a result of an applied voltage. Evenly spaced field lines 205 represent the uniform E-field. However, this uniform field would only exist in an infinitely wide structure. In actuality, the electric field at the edges is higher, and at sharp metal corners, the field can be infinitely high.

Figure 3:
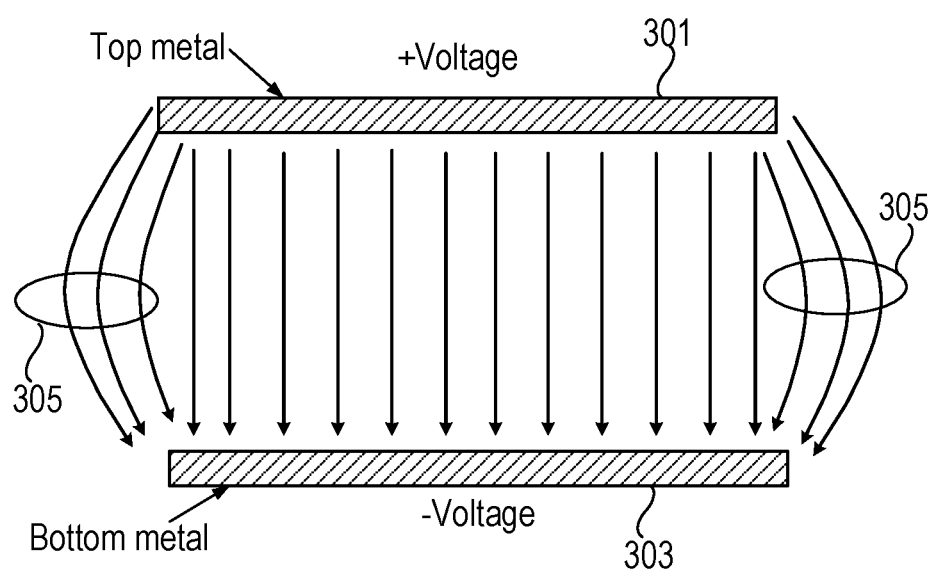
FIG. 3 illustrates fringe fields extending from edges of a finite parallel plate capacitor.

Referring to FIG. 3, rather than a uniform electric field as shown in FIG. 2, a finite width parallel plate capacitor has fringe fields extending from the plate 301 to plate 303 as shown by the field arrows 305. The fringe fields cause a field increase at plate corners as shown by the increased number of field lines that terminate near the corners of the capacitor plates. While theory says that an infinite field exists at a sharp corner, in reality, materials would breakdown in an infinite field.

Figure 4:
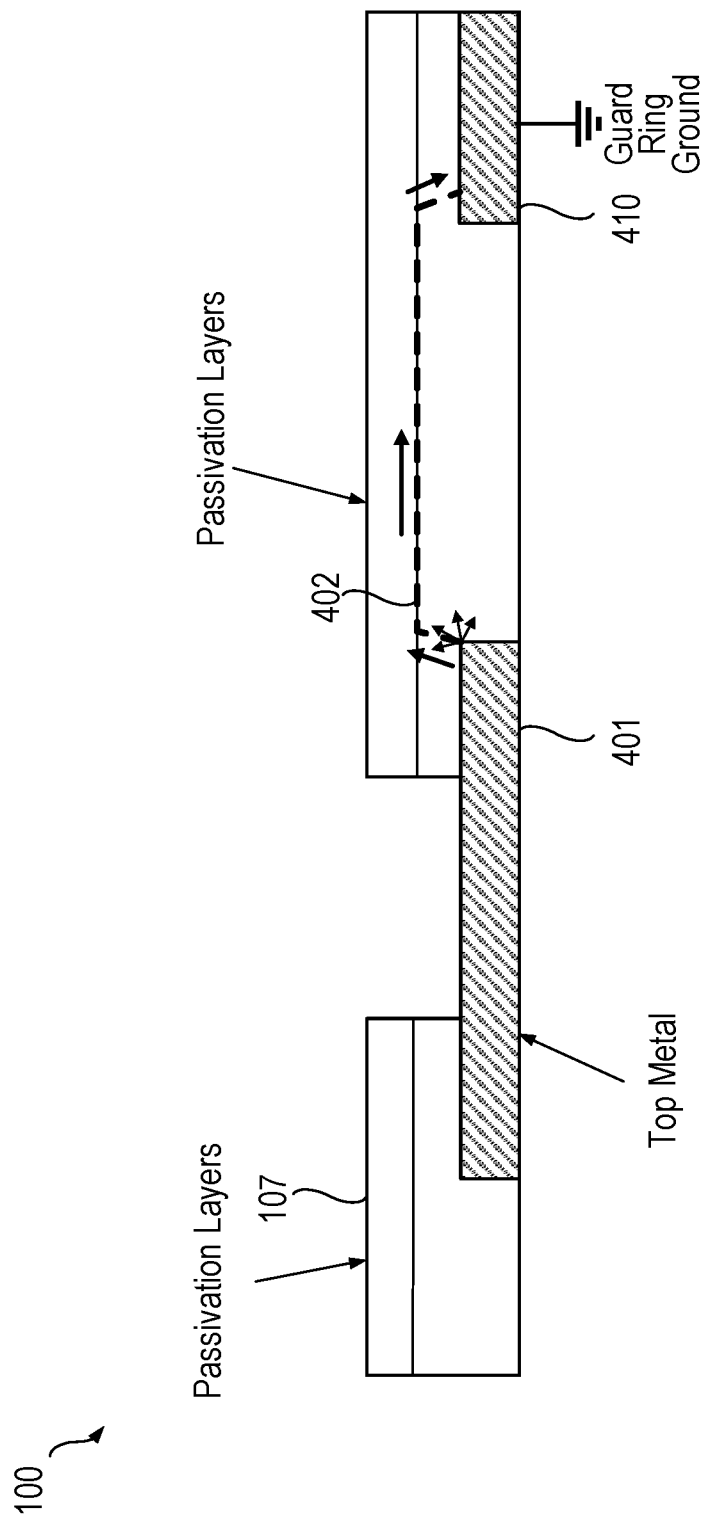
FIG. 4 illustrates high fields concentrated at the edge of the top metal plate of an isolation capacitor can reach the passivation layers and create a breakdown path resulting in charge transfer from the top metal to the guard ring.

Referring to FIG. 4, high fields concentrated at the edge of the top metal plate 401 can reach the passivation layers to create a breakdown path 402 resulting in charge transfer from the top metal 401 to the guard ring 410 along resistive paths at the surface of interfaces of the passivation layers or even at interfaces between in situ steps of the same layer. The more field seen at the weak point in the passivation layers (e.g., at interfaces of different passivation layers), the more likely a breakdown will occur. Typical passivation layer materials used include high density plasma (HDP) oxide, plasma enhanced (PE) oxide, SiN, and silicon rich oxide (SRO). The passivation layers are highly susceptible to process variation due to Gaussian distributions associated with deposition, chemical mechanical polishing (CMP) planarization steps, and other process steps associated with making the passivation layers. The particular materials used and thicknesses of the layers and thus the interfaces between layers vary significantly between fabrication facilities and even different generations of processes within the same fabrication facility. Thus, it would be desirable to reduce the likelihood of passivation layer failure without having to individually address process variations and variations in manufacturing approaches used to make isolation capacitors. Therefore embodiments draw down fields away from the passivation layers and thereby reduce the likelihood of failure in the passivation layers in an approach that is substantially immune to process variations.

Figure 5:
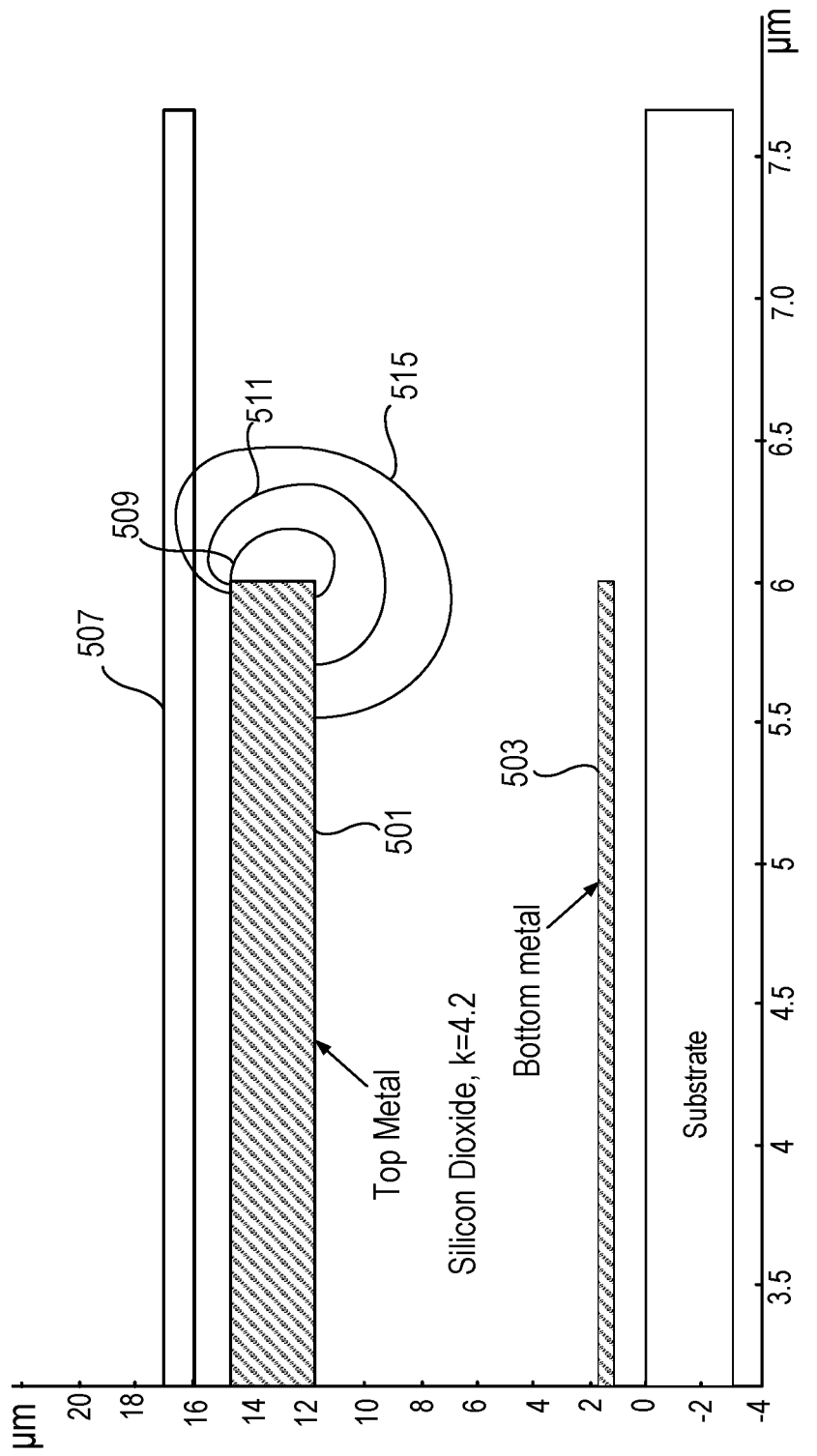
FIG. 5 illustrates that electric fields terminating at an edge of a top plate of an isolation capacitor can penetrate the passivation layers.

FIG. 5 illustrates electric fields for a structure such as shown in FIG. 1 with a top metal plate 501 and a bottom metal plate 503. The simulation shows that the field is concentrated at the edge of the top metal plate 501 and penetrates the passivation layers 507. FIG. 5 shows contour lines 509, 511, and 515 that approximate the electric field of the simulation results. The field inside contour line 509 has a maximum above 4 kV/μm. The field between contour line 509 and 511 ranges between 1 (or more) kV/μm and 0.8 kV/μm. Finally, the field between field line 511 and 515 represents a field of between approximately 0.8 kV/μm to 0.6 kV/μm. The field lines are approximate and will vary according to thicknesses of metal, types dielectric used, etc. Referring again to FIG. 1, the top corner of the top metal plate is very close to the interfaces in the passivation layers that are most likely to experience failure. As described above, the electric field falls off with the square of the distance. Accordingly, embodiments described herein increase separation between high fields associated with the top metal plate and passivation interface layers, and thereby reduce the electric field seen in the passivation layers and thus reduce the likelihood of horizontal failure caused by current flow between the top metal plate and the guard ring.

Figure 6:
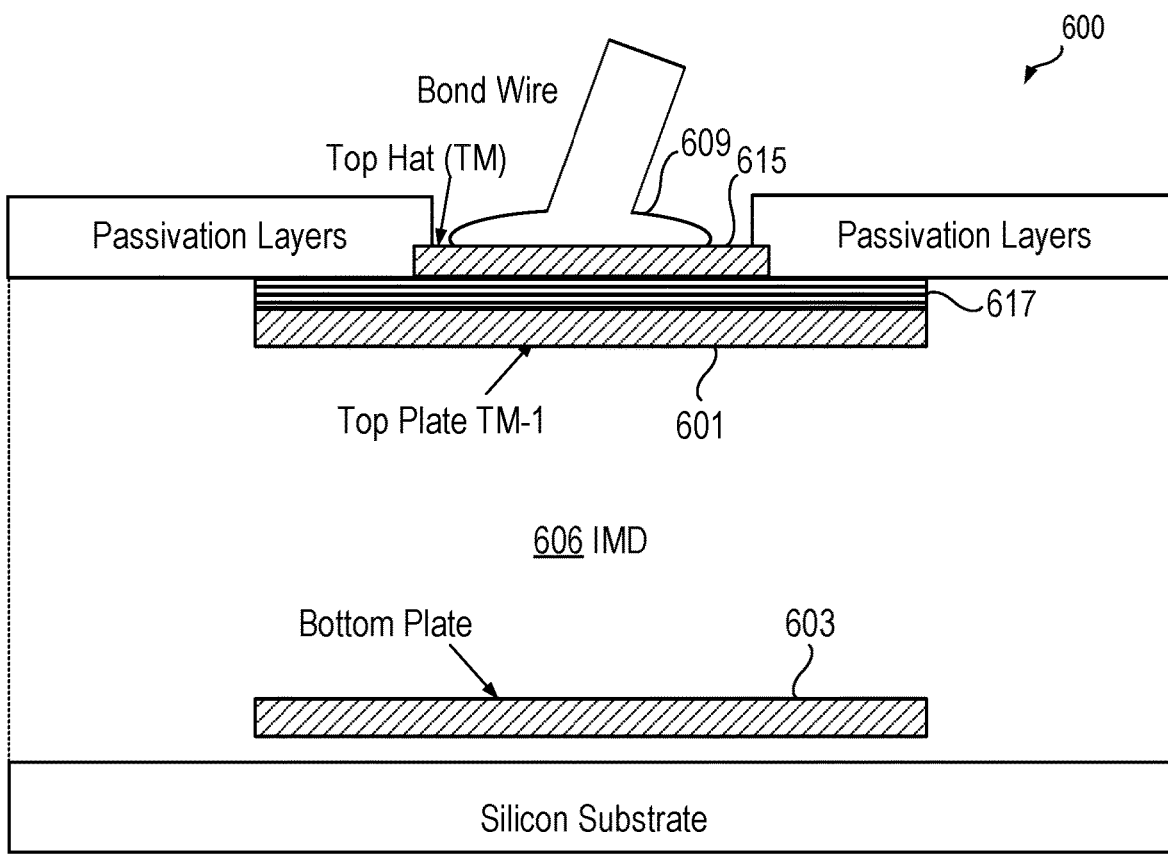
FIG. 6 illustrates an embodiment of an isolation capacitor structure having a "top hat" metal plate above the top metal plate of the capacitor thereby reducing fields in the passivation layers.

Referring to FIG. 6, an embodiment includes a metal "top hat" plate above the top metal layer. The isolation capacitor structure 600 shown in FIG. 6, includes a top metal plate 601 and a bottom metal plate 603 separated by an IMD layer 606. The IMD layer 606 is, e.g., 5-25 microns thick, with the thickness depending on such factors as the capacitance desired and the material used for the IMD layer. A new top metal top hat plate 615 sits above the top metal plate 601 and is separated from the top metal plate by IMD material 617 between the top metal plate 601 and the top hat structure 615. The IMD material could be a standard oxide such as SiO2 and be the same as the oxide in the stack of the primary isolator capacitor formed by top metal plate 601 and bottom metal plate 603. In other embodiments the IMD layer 617 is an alternative insulator material such as SiN, SRO, or SiON. The structure shown in FIG. 6 provides a series capacitor with the added capacitor formed by the top hat plate and the top metal plate of the primary capacitor. Note that since the top hat structure is now the highest metal, it is referred to as being top metal (TM), whereas the top metal plate is now TM-1, or one metal layer down. For example, in an embodiment, the top hat is in M8 and the top metal plate is in M7.

Figure 7:
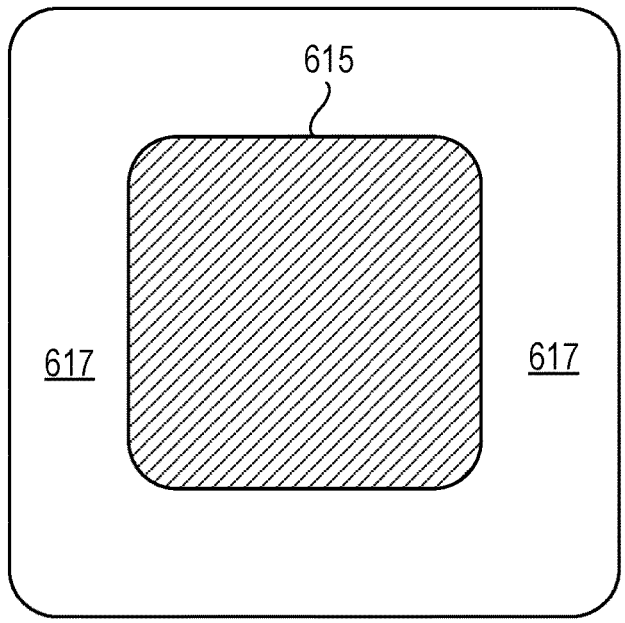
FIG. 7 shows a top view of the top hat structure above the IMD layer.

In a preferred embodiment, the top hat structure is smaller than the top metal plate. For example, in one embodiment, the top hat plate 615 is formed as a 76 μm×76 μm plate while the top metal plate 601 is 120 μm×120 μm. The size of the top hat plate should be large enough to support the bond wire 609. The dielectric material between the top hat plate and the top metal plate should be thin enough to allow some limited voltage drop, thereby allowing charge to flow while minimizing current induced self-heating and thus damage to the dielectric layer. In various embodiments the thickness of the top hat metal 615, the thickness of the top metal plate, and the thickness of the dielectric material between TM and TM-1 varies. For example, in an embodiment, thickness of the dielectric material 617 between the top hat plate and the top metal plate is 1.7 µm, the top hat plate is 3 µm, and the top metal plate is thinner than the top hat plate at 0.7 µm. With 5000 volts applied between the top hat plate and the bottom plate, in simulation the voltage at the top plate drops to 2715 V and the fields were reduced in the passivation layer as compared to the fields illustrated in FIG. 5. In other embodiments, the thickness of the dielectric material 617 is 0.5 µm, the top hat plate is 1 µm and the top metal plate is 3 µm. The metal plates can be formed of copper, aluminum, or any metal or metal alloy suitable in semiconductor processing. The dielectric material of the IMD layer 617 can of course be different than SiO2 as described earlier. With SiO2 being used for IMD 617, the voltage at the top metal plate (TM-1) was 4097 V so the top series capacitor had a voltage drop of approximately 903 V. With SiN, the voltage at the top metal plate (TM-1) was 4420 V and thus the voltage drop across the top series capacitor was reduced as compared to using SiO2. With a thin top hat plate (e.g., ~1 µm) and a thick top metal plate (e.g. ~3 µm) and a thin dielectric layer 617, the field in the passivation layer was significantly reduced such that fields below approximately 300 V/µm appear in the passivation layer in simulations. FIG. 7 shows a top view of the top hat structure 615 above the IMD layer 617.

Making the series capacitor embodiment of FIG. 6 includes depositing the bottom metal plate 603, depositing the IMD layer 606, depositing the top metal plate 601, the IMD layer 617, and the top hat plate 615 along with appropriate patterning and etch steps for the various capacitor components. By making the top hat plate smaller than the top metal plate, the edge of the top hat plate is farther from the guard ring. In addition, the top metal plate blocks the top hat plate from seeing the bottom metal plate resulting in no significant field being generated due to interactions between the bottom metal plate and the top hat plate. That reduces the field at the edge of the top hat plate as compared to embodiments without the top hat plate and thus reduces field in the passivation layer. Moving the top metal plate to TM-1 moves the high fields associated with the edge of the top metal plate further from the layers of the passivation layer that are more susceptible to failure. Simulation shows that utilizing the series capacitor structure with the top hat successfully reduced the field in the passivation layer but there was still significant field in the IMD layer 617. Accordingly, there is some risk of break down in the IMD layer 617 although such a break down would not necessarily cause a catastrophic failure.

Figure 8:
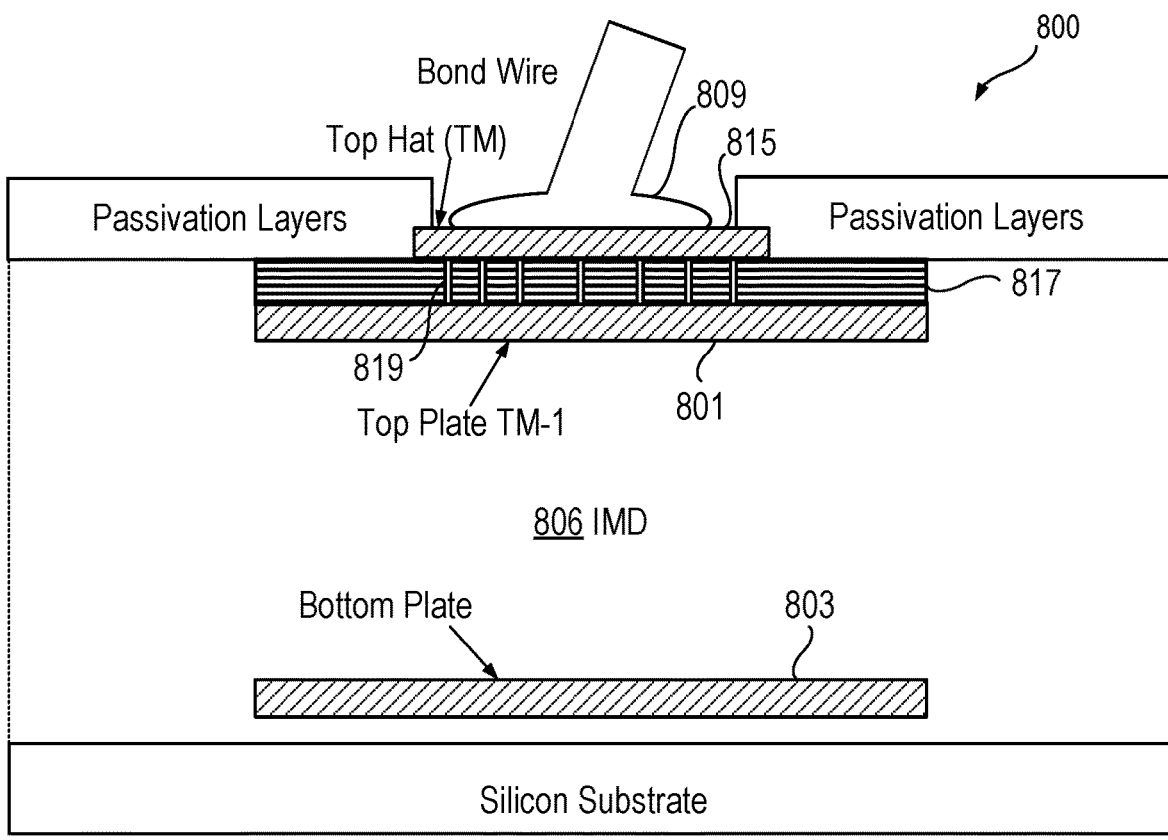
FIG. 8 illustrates an embodiment having a "top hat" metal plate above the top metal plate of a capacitor with vias in the dielectric layer coupling the top hat metal plate to the top metal plate.

Referring to FIG. 8, in another embodiment the isolation capacitor 800 includes a top metal plate 801 and a bottom metal plate 803 separated by an IMD layer 806. A top metal top hat plate 815 sits on top of the top metal plate 801 separated by IMD material 817 between the top metal plate 801 and the top hat plate 815. In embodiments, the IMD material is a standard oxide such as SiO2 and similar to IMD layer 806 or could be an alternative insulator material such as SiN, SRO, or SiON. The isolation capacitor 800 includes conductive vias 819 formed in the dielectric layer 817 to electrically couple the top hat plate 815 and the top metal plate 801. The addition of the conductive vias avoids damage to the dielectric of the top capacitor (formed by top hat plate 615 and top metal plate 601 in the embodiment of FIG. 6) by ensuring that the top hat plate 815 and the top metal plate 801 are at the same voltage. The approach shown in FIG. 8 allows for a thicker top hat structure, which allows more passivation on top of the isolation capacitor 800. A thicker top hat structure can include a thicker IMD layer 817 thereby shifting the top plate further down from the passivation layers subject to failure. The field lines terminate at the end of the top metal plate 801 (at TM-1) since the top hat plate 815 and the top metal plate 801 are at the same potential. In simulations applying 5000 V between the top hat plate and the bottom metal plate, the field in the passivation layers is reduced to 300 V/µm or less. Note that moving the top metal plate down can decrease the distance between the top metal plate 801 and the bottom metal plate 803, therefore the capacitance and isolation capabilities of the isolation capacitor can be affected. So there is a tradeoff between moving the top metal plate closer to the bottom metal plate that should be considered.

In an embodiment, the top hat plate 815 is formed as a 76 µm×76 µm plate while the top metal plate 801 is 120 µm×120 µm. The size of the top hat plate should be large enough to support the bond wire 809. The dielectric material between the top hat plate and the top metal plate no longer needs to allow for a voltage drop due to the presence of the vias allowing for thicker IMD 817. In various embodiments the thickness of the top hat metal 815, the thickness of the top metal plate 801, and the thickness of the dielectric material 817 between TM and TM-1 varies. For example, in an embodiment, the dielectric material 817 between the top hat plate and the top metal plate is 2.0 the top hat plate is 3 and the top metal plate is thinner than the top hat plate at 0.7 With 5000 volts applied between the top hat plate and the bottom plate, the fields were reduced in the passivation layer as compared to simulation of the embodiment illustrated in FIG. 5. In other embodiments, the thickness of dielectric material 817 is 0.5 the top metal plate is 3 µm and the top hat plate is 1 µm. The dielectric material of the IMD layer 817 can of course be different from SiO2 as described earlier.

Figure 9:
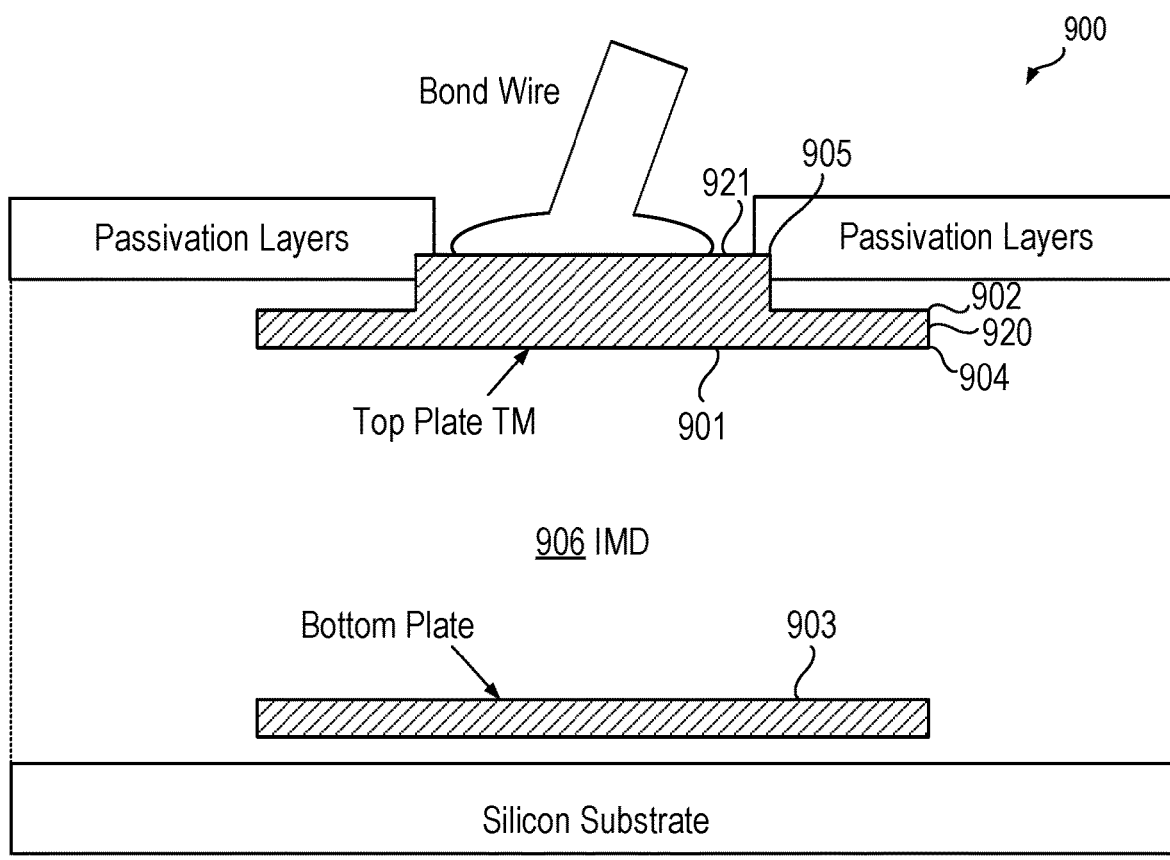
FIG. 9 illustrates another embodiment that reshapes the top metal plate to incorporate an integral top hat.

Referring to FIG. 9 in another embodiment isolation capacitor 900 reshapes the top metal plate 901 to increase the distance from the edge 920 of the top metal plate where the field lines terminate to the passivation layers susceptible to high electric fields from the top capacitor plate. The embodiment of FIG. 9 removes the insulator between the top metal plate and the top hat plate by forming an integral metal structure. The top metal plate 901 moves the top corner fields at corner 905 farther from the guard ring and moves the bottom corner fields at corners 902 and 904 farther from interface layers. The top metal plate with an integrated top hat 921 can be formed either through a dual step metal deposition or deposition of a thicker top metal followed by a second pattern and etch to create the top hat shape (the raised region 921). The top hat 921 should be sized to support the bond wire and in an embodiment has 76 µm×76 µm top surface while the top metal plate bottom surface is 120 µm×120 µm. Thus, the top surface area of the top hat is less than 50% of the bottom surface area of the top metal plate. In a typical embodiment the top metal plate is 3 µm thick including of 2 µm for the top hat portion 921 and 1 µm for the extended (120×120) base. Other embodiments use different thicknesses according to process capabilities and design requirements.

Figure 10:
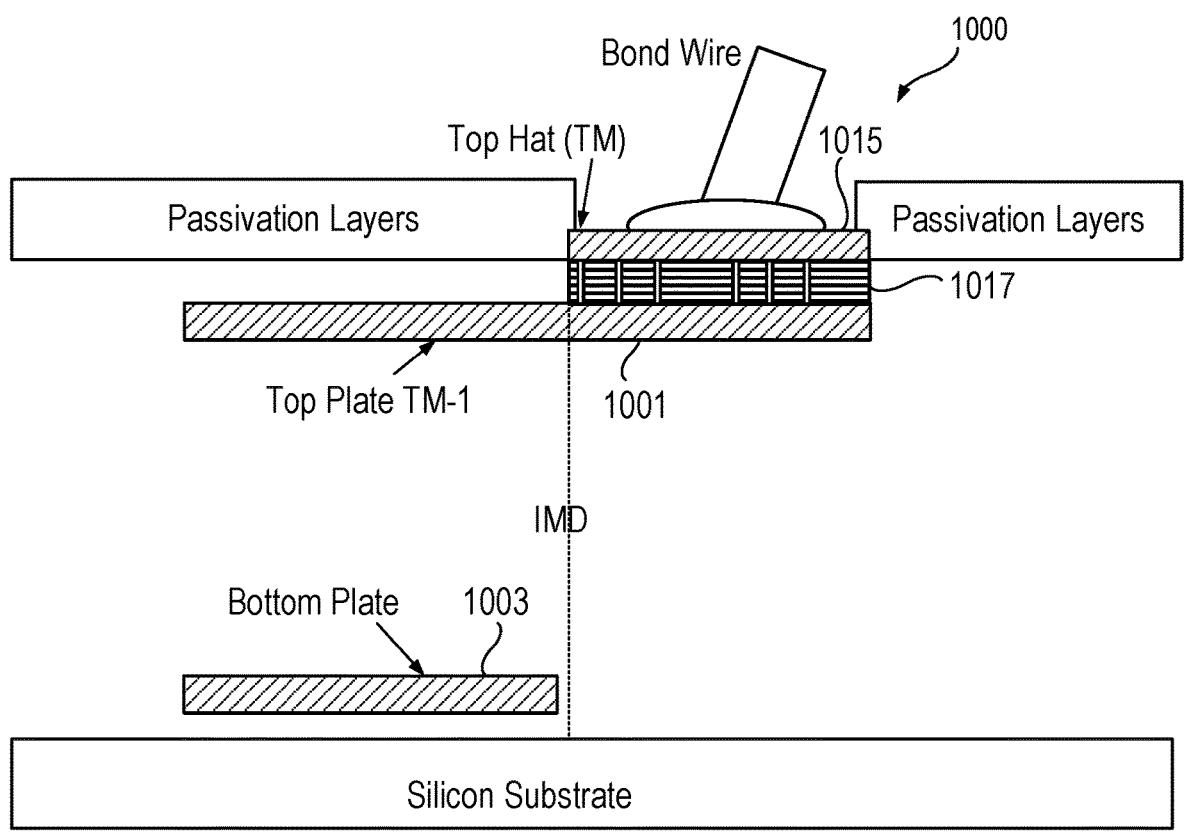
FIG. 10 illustrates another embodiment of isolation capacitor in which the top hat plate is placed off center of the top metal plate.

FIG. 10 illustrates another embodiment of isolation capacitor 1000 in which the top hat plate 1015 is placed on the side of the top metal plate 1001 and the bottom plate 1003 is smaller than the top plate 1001. The bottom plate 1003 can be outside the perimeter of the top hat plate 1015 and dielectric layer 1017 as shown or in another embodiment, part of the bottom plate extends under the top hat plate 1015 and dielectric layer 1017.

Thus, various aspects have been described related to an isolation capacitor structure with a top hat plate that reduces the risk of breakdown at interfaces in the passivation layer. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. An integrated circuit with an isolation capacitor comprising:
   a first conductive plate above a substrate;
   a second conductive plate above the first conductive plate;
   a first dielectric region between the first conductive plate and the second conductive plate;
   a third conductive plate above the second conductive plate, the first conductive plate, the second conductive plate, and the third conductive plate being conductive plates of the isolation capacitor on the integrated circuit with no conductive metal path formed between the first conductive plate and the second conductive plate, the third conductive plate having a first perimeter being recessed from a second perimeter of the second conductive plate, a first thickness of the second conductive plate differing from a second thickness of the third conductive plate;
   a second dielectric region between the second conductive plate and the third conductive plate, the third conductive plate being separated from the second conductive plate by a thickness of the second dielectric region, and a thickness of the first dielectric region differing from a thickness of the second dielectric region, the third conductive plate being off center from the second conductive plate in a first lateral direction, the first conductive plate being off center from the second conductive plate in a second lateral direction opposite the first lateral direction, and the first conductive plate being at least partially outside a perimeter of the third conductive plate; and
   a plurality of conductive vias formed in the second dielectric region to electrically couple the second conductive plate and the third conductive plate.

2. The integrated circuit as recited in claim 1 wherein the thickness of the first dielectric region ranges between 5 microns and 25 microns.

3. The integrated circuit as recited in claim 1 further comprising a bond wire electrically coupled to the third conductive plate.

4. The integrated circuit as recited in claim 1 wherein the thickness of the second dielectric region between the second conductive plate and the third conductive plate ranges between approximately 0.5 microns and 2.0 microns.

5. The integrated circuit as recited in claim 1 wherein the second dielectric region is formed of SiO2, SiN, silicon rich oxide, or SiON.

6. The integrated circuit as recited in claim 1 wherein the third conductive plate is smaller than the second conductive plate.

7. The integrated circuit as recited in claim 1 wherein the first conductive plate is outside the perimeter of the third conductive plate.

8. The integrated circuit as recited in claim 1 wherein the first dielectric region is formed of a first dielectric material and the second dielectric region is formed of a second dielectric material different than the first dielectric material.

9. A method of making an isolation capacitor comprising:
   forming a first conductive plate of an isolation capacitor above a substrate;
   forming a first dielectric region above the first conductive plate;
   forming a second conductive plate of the isolation capacitor above the first dielectric region with no conductive metal path formed between the first and second conductive plates of the isolation capacitor;
   forming a second dielectric region above the second conductive plate; and
   forming a third conductive plate of the isolation capacitor above the second dielectric region, a first thickness of the second conductive plate differing from a second thickness of the third conductive plate, and a thickness of the first dielectric region differing from a thickness of the second dielectric region;
   forming the third conductive plate such that a first perimeter of the third conductive plate is recessed from a second perimeter of the second conductive plate, the third conductive plate being off center from the second conductive plate in a first lateral direction, the first conductive plate being off center of the second conductive plate in a second lateral direction opposite the first lateral direction, and the first conductive plate being at least partially outside a perimeter of the third conductive plate; and
   forming conductive vias in the second dielectric region connecting the second conductive plate and the third conductive plate.

10. The method as recited in claim 9 further comprising forming the first dielectric region with the thickness of between 5 microns and 25 microns.

11. The method as recited in claim 9 further comprising electrically coupling a bond wire to the third conductive plate.

12. The method as recited in claim 9 further comprising forming the second dielectric region between the second conductive plate and the third conductive plate with the thickness of between approximately 0.5 microns and 2.0 microns.

13. The method as recited in claim 9 further comprising forming the second dielectric region of SiO2, SiN, silicon rich oxide, or SiON.

14. An isolation capacitor formed by the method of claim 9.

15. An isolation capacitor comprising:
   a first conductive plate above a substrate, a second conductive plate above the first conductive plate, and a third conductive plate above the second conductive plate, the third conductive plate having a first perimeter being recessed from a second perimeter of the second conductive plate, a first thickness of the second conductive plate differing from a second thickness of the third conductive plate, the third conductive plate being off center from the second conductive plate in a first lateral direction, the first conductive plate being off center from the second conductive plate in a second lateral direction opposite the first lateral direction, and the first conductive plate being at least partially outside the first perimeter of the third conductive plate;
   a first dielectric region between the first conductive plate and the second conductive plate with no conductive metal path formed between the first conductive plate and the second conductive plate, and a second dielectric region between the second conductive plate and the third conductive plate, the third conductive plate being separated from the second conductive plate by a thickness of the second dielectric region, a top surface of the third conductive plate exposed by an opening in one or more passivation layers positioned above the second dielectric region, and a thickness of the first dielectric region differing from a thickness of the second dielectric region; and a plurality of conductive vias formed in the second dielectric region to electrically couple the second conductive plate and the third conductive plate.

16. The isolation capacitor as recited in claim 15 wherein the first dielectric region is formed of a first dielectric material and the second dielectric region is formed of a second dielectric material different than the first dielectric material.

* * * * *